(12) United States Patent
Ogata et al.

(10) Patent No.: US 7,876,105 B2
(45) Date of Patent: Jan. 25, 2011

(54) SENSOR DEVICE AND DISPLAY APPARATUS (75) Inventors: Masako Ogata, Yokohama (JP); Kazuhiro Suzuki, Tokyo (JP); Hideyuki Funaki, Tokyo (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 314 days.

(21) Appl. No.: 12/211,843

(22) Filed: Sep. 17, 2008

(65) Prior Publication Data

US 2009/0079443 A1 Mar. 26, 2009

(30) Foreign Application Priority Data

Sep. 25, 2007 (JP) .............................. 2007-246992

(51) Int. Cl.
*G01R 27/26* (2006.01)
(52) U.S. Cl. ...................................... 324/662; 324/671
(58) Field of Classification Search ................. 324/662, 324/661, 658, 649, 635, 644, 671, 699, 716, 324/718, 456, 216, 237, 238, 240, 600, 555
See application file for complete search history.

(56) References Cited

U.S. PATENT DOCUMENTS

| | | | | |
|---|---|---|---|---|
| 3,764,899 A * | 10/1973 | Peterson et al. | ............. | 324/671 |
| 4,182,981 A * | 1/1980 | Shum et al. | .................. | 324/662 |
| 4,914,378 A * | 4/1990 | Hayashi et al. | ............. | 324/696 |
| 5,065,103 A * | 11/1991 | Slinkman et al. | ............ | 324/458 |
| 5,551,288 A * | 9/1996 | Geraldi et al. | ........... | 73/170.26 |
| 5,966,018 A * | 10/1999 | Edmunds et al. | ............ | 324/663 |
| 6,911,828 B1 * | 6/2005 | Brossia et al. | .............. | 324/649 |
| 7,006,233 B2 * | 2/2006 | Kozhukh et al. | ............ | 356/491 |
| 2008/0181353 A1 | 7/2008 | Ogata et al. | | |
| 2009/0086879 A1 | 4/2009 | Ogata et al. | | |

FOREIGN PATENT DOCUMENTS

| | | |
|---|---|---|
| JP | 11-017515 | 1/1999 |
| JP | 2003-043078 | 2/2003 |

\* cited by examiner

*Primary Examiner*—Hoai-An D Nguyen
(74) *Attorney, Agent, or Firm*—Turocy & Watson, LLP (57) ABSTRACT A sensor device according to an embodiment of the present invention includes an electrode array having plural electrodes arranged in an array manner, a signal generator configured to generate a first signal having a first frequency, and apply the first signal to the plural electrodes, and a detection unit configured to, when the first signal is applied to the plural electrodes, and a second signal having a second frequency is applied to an object to be detected, detect a distance between each electrode included in the electrode array and the surface of the object, using an interference wave between the first signal applied to each electrode and the second signal applied to the object, or detect irregularities on the surface of the object, using a signal generated by using the interference wave outputted from one electrode and the interference wave outputted from another electrode.

20 Claims, 8 Drawing Sheets

SENSOR DEVICE AND DISPLAY APPARATUS

CROSS REFERENCE TO RELATED APPLICATIONS

This application is based upon and claims the benefit of priority from the prior Japanese Patent Application No. 2007-246992, filed on Sep. 25, 2007, the entire contents of which are incorporated herein by reference.

BACKGROUND OF THE INVENTION

1. Field of the Invention

The present invention relates to a sensor device and a display apparatus.

2. Background Art

In recent years, various types of proximity sensors have been developed. A proximity sensor is configured to detect proximity of an object. Examples of a sensing method performed by the proximity sensor include a resistive film method, infrared method, supersonic method, and capacitance method, each of which has a merit and a demerit. Examples of the proximity sensor are disclosed in Japanese Patent No. 3505961 and JP-A 2003-43078 (KOKAI).

The capacitance sensor is configured to detect proximity of an object to the sensor, by detecting a change in capacitance between the object and the sensor. The capacitance sensor has a feature that the sensor can detect proximity of the object even if the sensor is in no contact with the object, provided that the capacitance is within a detectable range. Recently, an optical sensor is popular as a non-contact type proximity sensor. However, the optical sensor has a demerit that the sensor is affected by ambient brightness. On the contrary, the capacitance sensor generally has no problem with ambient brightness.

The capacitance sensor detects proximity of an object by detecting a micro signal caused by movement of the object. Accordingly, in the capacitance sensor, it is important to realize a satisfactory S/N ratio for detecting the micro signal. In general, the capacitance sensor gives an AC signal to the object, and detects a change in the amplitude or phase of the AC signal resulting from a change in capacitance. In this case, to improve accuracy of detecting the object, it is necessary to take measures such as making the frequency of the AC signal variable, to realize a circuit system sensitive to a change in capacitance, and adding a time series detection unit (such as a counter) to a filtering unit. However, the former method may be restricted by frequency band, and the latter needs a timing circuit for synchronizing an input signal with an output signal.

SUMMARY OF THE INVENTION

An aspect of the present invention is, for example, a sensor device including an electrode array having plural electrodes arranged in an array manner, a signal generator configured to generate a first signal having a first frequency, and apply the first signal to the plural electrodes, and a detection unit configured to, when the first signal is applied to the plural electrodes, and a second signal having a second frequency is applied to an object to be detected, detect a distance between each electrode included in the electrode array and the surface of the object, using an interference wave between the first signal applied to each electrode and the second signal applied to the object, or detect irregularities on the surface of the object, using a signal generated by using the interference wave outputted from one electrode and the interference wave outputted from another electrode.

Another aspect of the present invention is, for example, a sensor device including an electrode array having plural electrodes arranged in an array manner, a signal generator configured to generate a first signal having a first frequency, and apply the first signal to the plural electrodes, and a detection unit configured to, when the first signal is applied to the plural electrodes, and a second signal having a second frequency is applied to a first object to be detected, identify the first object based on the second frequency, and detect a distance between each electrode included in the electrode array and the surface of the first object, using an interference wave between the first signal applied to each electrode and the second signal applied to the first object, or detect irregularities on the surface of the first object, using a signal generated by using the interference wave outputted from one electrode and the interference wave outputted from another electrode, and when the first signal is applied to the plural electrodes, and a third signal having a third frequency is applied to a second object to be detected, identify the second object based on the third frequency, and detect a distance between each electrode included in the electrode array and the surface of the second object, using an interference wave between the first signal applied to each electrode and the third signal applied to the second object, or detect irregularities on the surface of the second object, using a signal generated by using the interference wave outputted from one electrode and the interference wave outputted from another electrode.

Another aspect of the present invention is, for example, a display apparatus including an electrode array having plural electrodes arranged in an array manner, a signal generator configured to generate a first signal having a first frequency, and apply the first signal to the plural electrodes, a detection unit configured to, when the first signal is applied to the plural electrodes, and a second signal having a second frequency is applied to an object to be detected, detect a distance between each electrode included in the electrode array and the surface of the object, using an interference wave between the first signal applied to each electrode and the second signal applied to the object, or detect irregularities on the surface of the object, using a signal generated by using the interference wave outputted from one electrode and the interference wave outputted from another electrode, and a display unit configured to display a shape of the surface of the object on a screen, using the distance or the irregularities detected regarding the object.

Another aspect of the present invention is, for example, a display apparatus including an electrode array having plural electrodes arranged in an array manner, a signal generator configured to generate a first signal having a first frequency, and apply the first signal to the plural electrodes, a detection unit configured to, when the first signal is applied to the plural electrodes, and a second signal having a second frequency is applied to a first object to be detected, identify the first object based on the second frequency, and detect a distance between each electrode included in the electrode array and the surface of the first object, using an interference wave between the first signal applied to each electrode and the second signal applied to the first object, or detect irregularities on the surface of the first object, using a signal generated by using the interference wave outputted from one electrode and the interference wave outputted from another electrode, and when the first signal is applied to the plural electrodes, and a third signal having a third frequency is applied to a second object to be detected, identify the second object based on the third frequency, and detect a distance between each electrode included in the electrode array and the surface of the second object, using an interference wave between the first signal applied to each electrode and the third signal applied to the second object, or detect irregularities on the surface of the second object, using a signal generated by using the interference wave outputted from one electrode and the interference wave outputted from another electrode, and a display unit configured to display a shape of the surface of the first object on a screen, using the distance or the irregularities detected regarding the first object, and display a shape of the surface of the second object on a screen, using the distance or the irregularities detected regarding the second object.

DESCRIPTION OF THE EMBODIMENTS

Embodiments of the present invention will be described below with reference to the accompanying drawings.

First Embodiment

Figure 1:
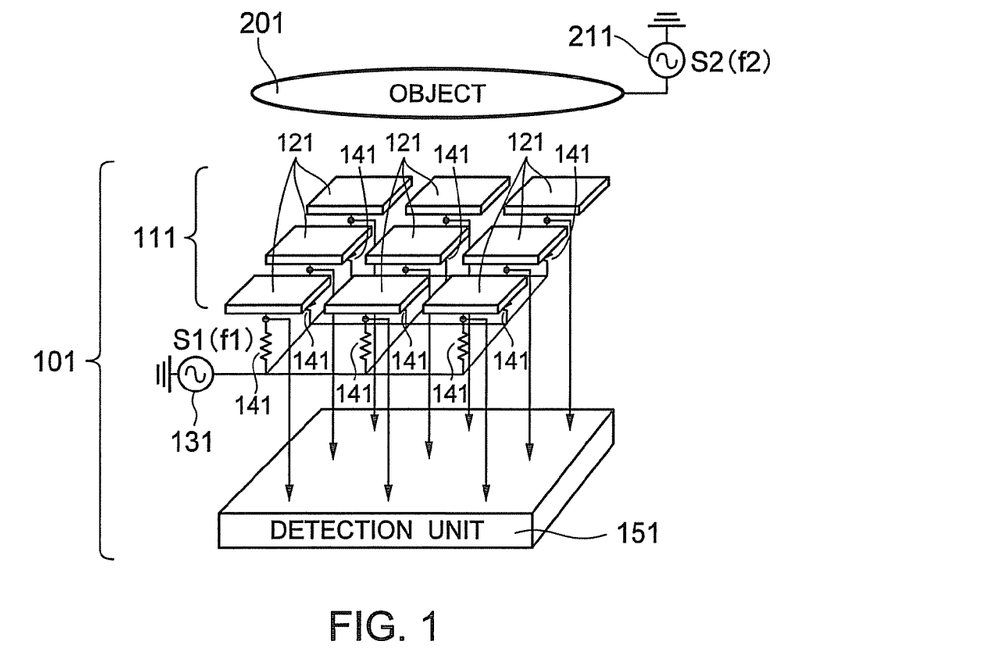
FIG. 1 is a drawing for illustrating a sensor device according to a first embodiment.

FIG. 1 is a drawing for illustrating a sensor device 101 according to a first embodiment. FIG. 1 illustrates the sensor device 101, and an object 201 to be detected. The sensor device 101 in this embodiment is a non-contact type proximity sensor, more particularly, a capacitance sensor.

The sensor device 101 includes an electrode array 111. The electrode array 111 has plural electrodes 121 arranged in an array manner. The electrodes 121 are arranged as a two-dimensional array in this embodiment, but may be arranged as a one-dimensional array.

The sensor device 101 is provided with a first signal generator 131. The first signal generator 131 generates a first AC signal S1 having a first frequency f1. The first signal generator 131 may be capable or incapable of changing the first frequency f1, but is capable of changing the first frequency f1 in this embodiment. The first AC signal S1 is applied to the plural electrodes 121. A resistor 141 is connected between each electrode 121 and the first signal generator 131.

Figure 2:
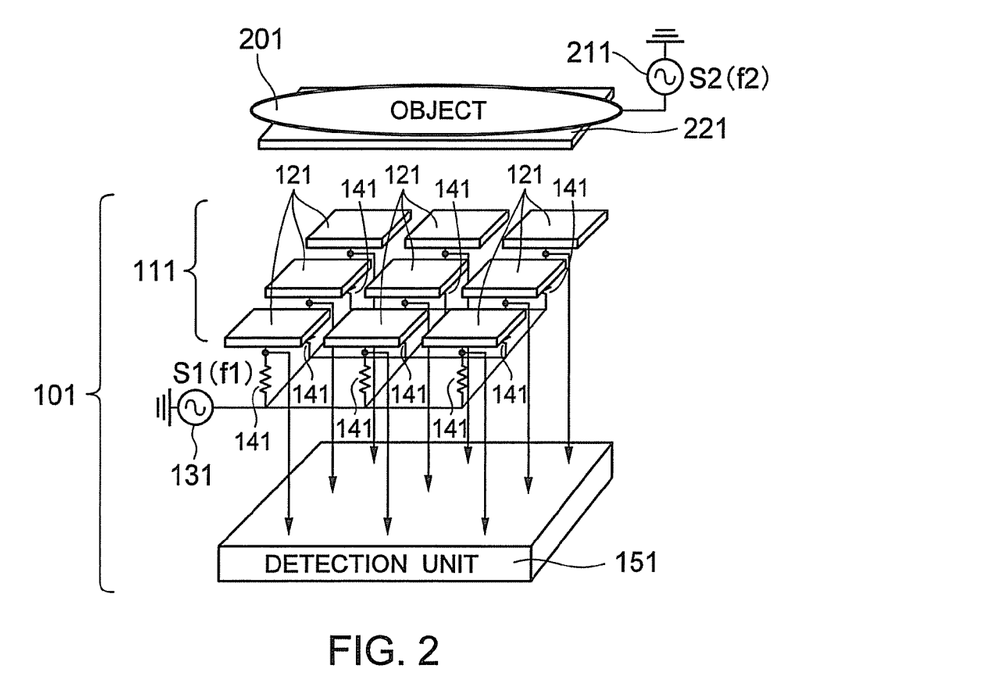
FIG. 2 is a drawing for illustrating a sensor device according to the first embodiment.

The object 201 is provided with a second signal generator 211. The second signal generator 211 generates a second AC signal S2 having a second frequency f2. The second signal generator 211 may be capable or incapable of changing the second frequency f2, but it is capable of changing the second frequency f2 in this embodiment. The second AC signal S2 is applied to the object 201. As illustrated in FIG. 2, the object 201 may be provided with an electrode 221. FIG. 2 illustrates the electrode 221 provided on the surface of the object 201. As illustrated in FIG. 1, the second AC signal S2 may be applied to the object 201 itself. Further, as illustrated in FIG. 2, the second AC signal S2 may be applied to the electrode 221 provided on the object 201. Hereinafter, the description will be continued returning to FIG. 1. The following description is also applicable to FIG. 2.

In this embodiment, the first frequency f1 is made different from the second frequency f2. Accordingly, in this embodiment, when the first signal S1 is applied to each electrode 121 and the second signal S2 is applied to the object 201, there occurs an interference wave between the applied first signal S1 and the applied second signal S2. The interference wave contains a low-frequency envelope component (beat) whose frequency is f2−f1, the difference frequency between the first frequency f1 and the second frequency f2.

In the sensor device 101, an interference wave between the applied first signal S1 and the applied second signal S2 is outputted from each electrode 121. The interference wave outputted from each electrode 121 is detected by a detection unit 151 of the sensor device 101. A waveform of each interference wave depends on capacitance between each electrode 121 and the surface of the object 201, and a value of the capacitance depends on a distance between each electrode 121 and the object 201. Accordingly, the detection unit 151 in FIG. 1 detects the distance between each electrode 121 and the surface of the object 201, using the interference wave between the first signal S1 applied to each electrode 121 and the second signal S2 applied to the object 201. In this embodiment, a non-contact type proximity sensor is realized by such a detection method.

The detection unit 151 in FIG. 1 detects the distance between each electrode 121 and the surface of the object 201, using an envelope component of each interference wave. The frequency of the envelope component is expressed by f2−f1 as described above. The frequency of the envelope component can be arbitrarily set, by setting the first frequency f1 and the second frequency f2. In this embodiment, a envelope component having a low frequency can be generated from the AC signals S1 and S2 having high frequencies. In this embodiment, by using such a envelope component for detection, a proximity sensor having high resistance to interference and excellent resistance to noise can be realized. The envelope component included in the interference wave can be extracted, for example, by a low-pass filter.

In this embodiment, the first signal generator 131 is able to change setting of the first frequency f1, and the second signal generator 211 is able to change setting of the second frequency f2. This can improve the setting flexibility of the frequencies of the AC signals S1 and S2, and the setting flexibility of the frequency of the envelope component of the interference wave.

Figure 3:
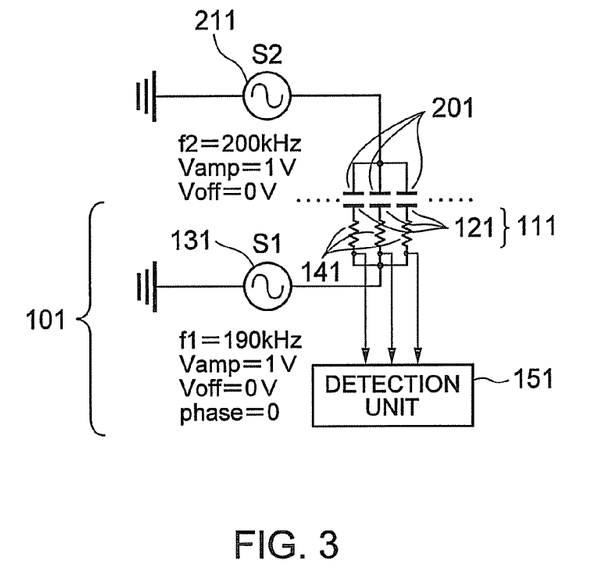
FIG. 3 shows an equivalent circuit of a system shown in FIG. 1.

FIG. 3 shows an equivalent circuit of a system shown in FIG. 1. FIG. 3 illustrates plural capacitors constituted by the plural electrodes 121 and the object 201. The first signal S1 having the first frequency f1 is applied to each electrode 121. The second signal S2 having the second frequency f2 is applied to the object 201. The ratio of the first frequency f1 to the second frequency f2 (f2/f1) is set, for example, to 1±0.05 to 1±0.25. This generates a low-frequency envelope component from the high-frequency AC signals S1 and S2. The amplitude of the first signal S1 and the first frequency f1 are set, for example, to 1V and 190 kHz. The amplitude of the second signal S2 and the second frequency f2 are set, for example, to 1V and 200 kHz.

Figure 4:
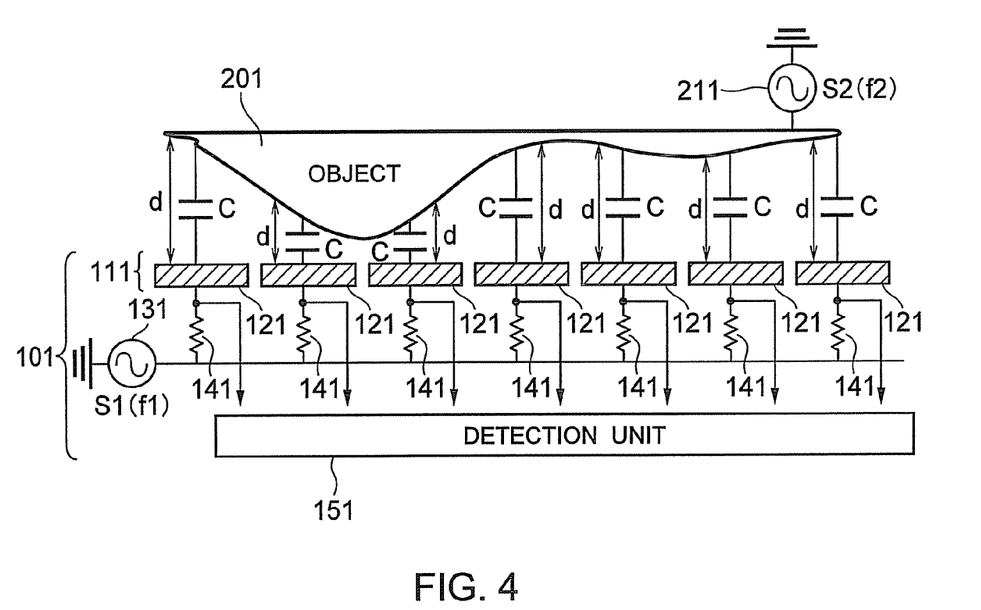
FIG. 4 shows a sectional view of the system shown in FIG. 1.

FIG. 4 shows a sectional view of the system shown in FIG. 1. FIG. 4 illustrates capacitance "C" between each electrode 121 and the surface of the object 201, and a distance "d" between each electrode 121 and the surface of the object 201. Each "C" shown in FIG. 4 corresponds to capacitance of a capacitor shown in FIG. 3.

Figure 5:
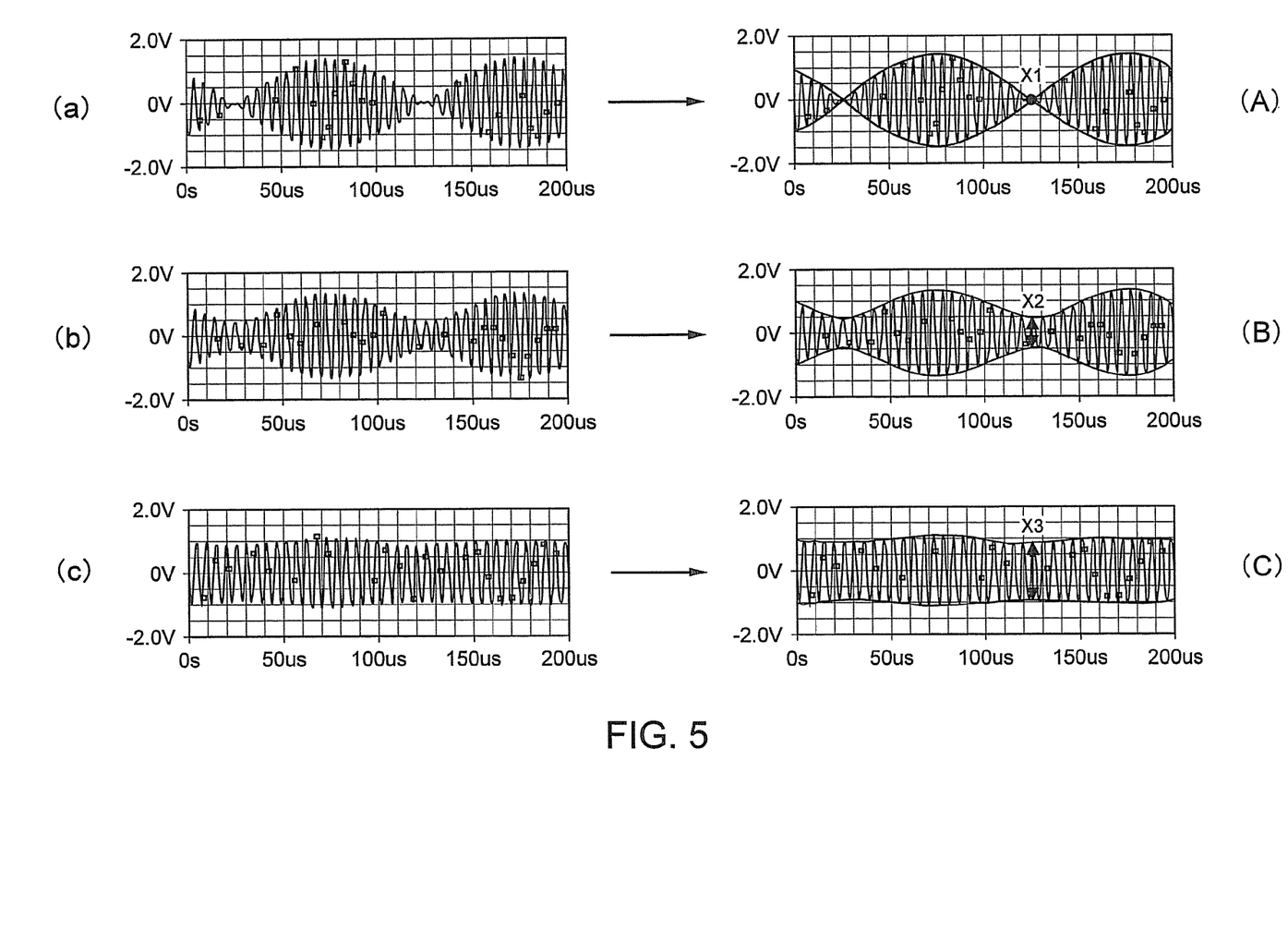
FIG. 5 shows a drawing for illustrating an envelope component of an interference wave.

FIG. 5 shows a drawing for illustrating an envelope component of an interference wave. FIG. 5a to 5c illustrate first to third examples of waveforms of interference waves. Further, FIG. 5A to 5C illustrate envelope components of the interference waves of FIGS. 5a to 5c. FIG. 5A illustrates an amplitude of a node of the envelope component by X1. FIG. 5B illustrates an amplitude of a node of the envelope component by X2. FIG. 5C illustrates an amplitude of a node of the envelope component by X3. In FIG. 5, X1=0, X2≠0, and X3≠0.

FIGS. 5a, 5b, and 5c show examples of interference waves obtained when the distances "d" shown in FIG. 4 are small, medium, and large. As illustrated, the waveforms of the interference waves in this embodiment change according to distances "d". Accordingly, in this embodiment, as described above, the distances "d" can be detected, using the interference waves. FIGS. 5A, 5B, and 5C show examples of envelope components obtained when the distances "d" shown in FIG. 4 are small, medium, and large. As illustrated, the waveforms of the envelope components in this embodiment change according to distances "d". Accordingly, in this embodiment, as described above, the distances "d" can be detected, using the envelope components. In the following example, the distances "d" are detected, using the amplitudes of the envelope components of the interference waves.

In this embodiment, as illustrated in FIGS. 5A, 5B, and 5C, the amplitude of a node of an envelope component changes according to the distance "d". Accordingly, the detection unit 151 in this embodiment can detect a distance "d" between each electrode 121 and the surface of the object 201, using the amplitude of a node of the envelope component. In this case, it is desirable that a distance "d" at which the amplitude of a node is zero, as illustrated in FIG. 5A, is set to a criterion for distance measurement. This improves accuracy of distance measurement. In using the amplitude of the envelope component for detection, the amplitude of any portion other than a node may be used.

Figure 6:
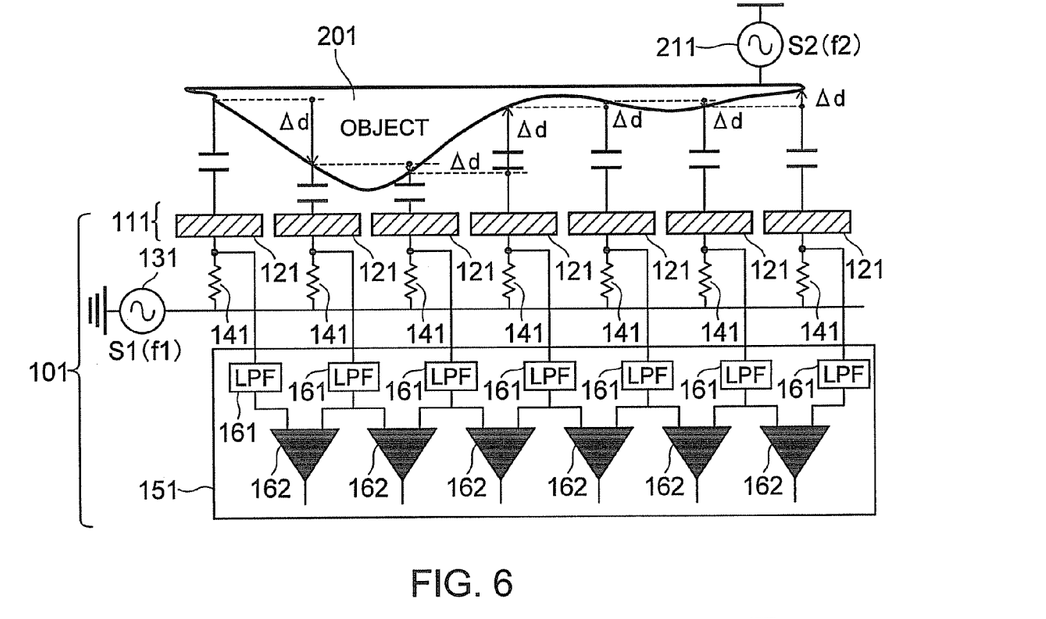
FIG. 6 shows a sectional view of the system shown in FIG. 1.

The detection unit 151 in this embodiment may detect a signal generated by using an interference wave outputted from one electrode 121 and an interference wave outputted from another electrode 121, instead of detecting an interference wave outputted from each electrode 121. Referring to FIG. 6, an example of such a detection process will be described below. In FIG. 6, the detection unit 151 detects irregularities on the surface of the object 201, using a signal generated by using an interference wave outputted from one electrode 121 and an interference wave outputted from another electrode 121.

Irregularities on the surface of the object 201 are expressed, for example, by "Δd" shown in FIG. 6. A "Δd" shown in FIG. 6 is a difference between a distance "d" at one electrode 121 and a distance "d" at another electrode 121. The former electrode 121 and the latter electrode 121 are adjacent to each other, in this embodiment. As described above, a distance "d" can be detected, using the amplitude of an envelope component at each electrode 121. Accordingly, "Δd" can be detected, using the amplitude of a difference signal between the envelope component at one electrode 121 and the envelope component at another electrode 121. Accordingly, the detection unit 151 in FIG. 6 generates a difference signal between envelope components of interference waves from one electrode 121 and another electrode 121, and detects irregularities on the surface of the object 201, using an amplitude of the difference signal. The detection unit 151 in FIG. 6 includes plural low-pass filters 161 and plural differential amplifiers 162. Each low-pass filter 161 extracts an envelope component of an interference wave from the corresponding electrode 121. Each differential amplifier 162 generates a difference signal between one envelope component and another envelope component.

Figure 7:
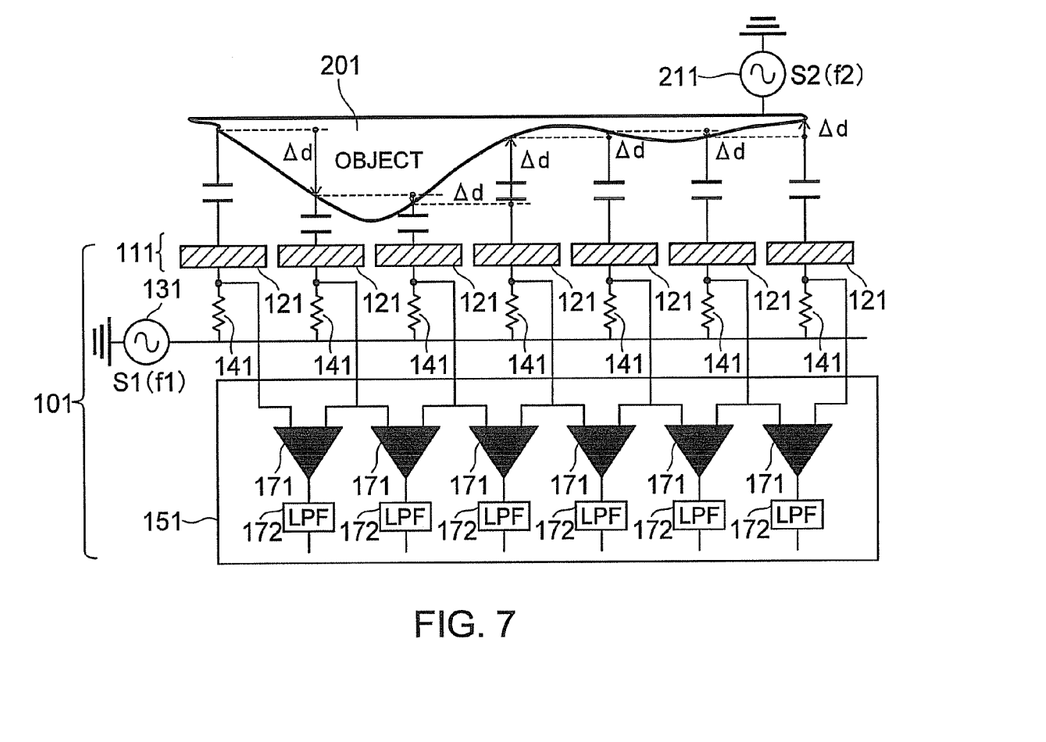
FIG. 7 shows a sectional view of the system shown in FIG. 1.

FIG. 7 shows a variation of the detection process of FIG. 6. The detection unit 151 in FIG. 7 generates a difference signal between an interference wave from one electrode 121 and an interference wave from another electrode 121, and detects irregularities on the surface of the object 201, using an amplitude of an envelope component of the difference signal. Thereby, a detection process similar to that of FIG. 6 can be realized. The detection unit 151 in FIG. 7 includes plural differential amplifiers 171 and plural low-pass filters 172. Each differential amplifier 171 generates a difference signal between an interference wave from one electrode 121 and an interference wave from another electrode 121. Each low-pass filter 172 extracts an envelope component of the corresponding difference signal.

In the detection processes of FIGS. 6 and 7, detection of distances "d" is not required to detect differences "Δd". Accordingly, the detection processes of FIGS. 6 and 7 are useful, for example, in a case where information of distances regarding the object 201 is not required, although information of irregularities regarding the object 201 is required. In detecting the difference signal, the detection unit 151 in FIG. 6 may detect the irregularities larger than a predetermined gradient, by detecting the amplitude larger than a predetermined threshold. This reduces a load for the detection process. Similarly, in detecting the amplitude of the envelope component of the difference signal, the detection unit 151 in FIG. 7 may detect the irregularities larger than a predetermined gradient, by detecting the amplitude larger than a predetermined threshold.

Figure 8:
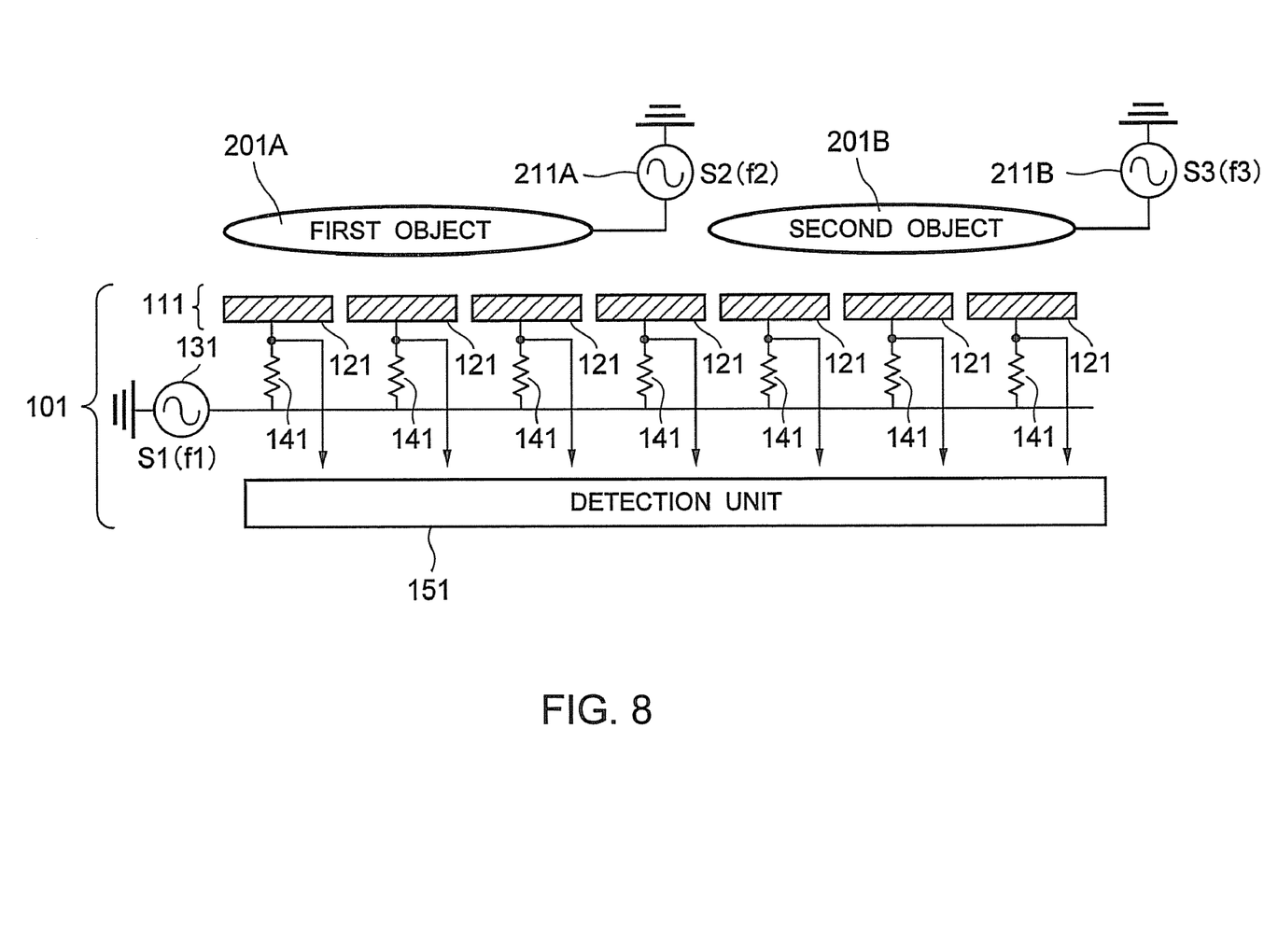
FIG. 8 is a drawing for illustrating a sensor device according to the first embodiment.

The sensor device 101 in this embodiment can handle not only one object 201 but also two or more objects 201. Referring to FIG. 8, an example of such a sensor device 101 will be described. FIG. 8 illustrates a sensor device 101, a first object 201A to be detected, and a second object 201B to be detected. The sensor device 101 in this embodiment is a non-contact type proximity sensor, more particularly, a capacitance sensor.

The sensor device 101 in FIG. 8 includes an electrode array 111 and a detection unit 151, like the sensor device 101 in FIG. 1. The sensor device 101 in FIG. 8 is provided with a first signal generator 131, like the sensor device 101 in FIG. 1. The first signal generator 131 generates a first AC signal S1 having a first frequency f1. The first signal generator 131 may be capable or incapable of changing the first frequency f1, but is capable of changing the first frequency f1 in this embodiment.

The first and second objects 201A and 201B are provided with second and third signal generators 211A and 211B respectively. The second signal generator 211A generates a second AC signal S2 having a second frequency f2. A third signal generator 211B generates a third AC signal S3 having a third frequency f3. The second signal generator 211A may be capable or incapable of changing the second frequency f2, but is capable of changing the second frequency f2 in this embodiment. The third signal generator 211B may be capable or incapable of changing the third frequency f3, but is capable of changing the third frequency f3 in this embodiment.

The second and third AC signals S2 and S3 are applied to the first and second objects 201A and 201B respectively. The second AC signal S2 may be applied to the first object 201A itself, or may be applied to an electrode (221) provided on the first object 201A as illustrated in FIG. 2. The third AC signal S3 may be applied to the second object 201B itself, or may be applied to an electrode (221) provided on the second object 201B as illustrated in FIG. 2.

In this embodiment, the first frequency f1 is made different from the second frequency f2. Accordingly, in this embodiment, when the first signal S1 is applied to each electrode 121 and the second signal S2 is applied to the first object 201A, there occurs an interference wave between the applied first signal S1 and the applied second signal S2. The interference wave contains a low frequency envelope component (beat) whose frequency is f2−f1, the difference frequency between the first frequency f1 and the second frequency f2. The ratio of the first frequency f1 to the second frequency f2 (f2/f1) is set, for example, to 1±0.05 to 1±0.25.

In this embodiment, the first frequency f1 is made different from the third frequency f3. Accordingly, in this embodiment, when the first signal S1 is applied to each electrode 121 and the third signal S3 is applied to the second object 201B, there occurs an interference wave between the applied first signal S1 and the applied third signal S3. The interference wave contains a low frequency envelope component (beat) whose frequency is f3−f1, the difference frequency between the first frequency f1 and the third frequency f3. The ratio of the first frequency f1 to the third frequency f3 (f3/f1) is set, for example, to 1±0.05 to 1±0.25.

In the sensor device 101 of the former case, an interference wave between the applied first signal S1 and the applied second signal S2 is outputted from each electrode 121. The interference wave outputted from each electrode 121 is detected by the detection unit 151. The detection unit 151 detects a distance between each electrode 121 and the surface of the first object 201A, using the interference wave between the first signal S1 applied to each electrode 121 and the second signal S2 applied to the first object 201A. The detection unit 151 may detect irregularities on the surface of the first object 201A, using a signal generated by using an interference wave outputted from one electrode 121 and an interference wave outputted from another electrode 121.

In the sensor device 101 of the latter case, an interference wave between the applied first signal S1 and the applied third signal S3 applied is outputted from each electrode 121. The interference wave outputted from each electrode 121 is detected by the detection unit 151. The detection unit 151 detects a distance between each electrode 121 and the surface of the second object 201B, using the interference wave between the first signal S1 applied to each electrode 121 and the third signal S3 applied to the second object 201B. The detection unit 151 may detect irregularities on the surface of the second object 201B, using a signal generated by using an interference wave outputted from one electrode 121 and an interference wave outputted from another electrode 121.

Furthermore, in this embodiment, the second frequency f2 is made different from the third frequency f3. Accordingly, when the second signal S2 is applied to the first object 201A, the detection unit 151 can identify the first object 201A based on the second frequency f2. In other words, the detection unit 151 can recognize the detected signal as a signal regarding the first object 201A. The detection unit 151 may identify the first object 201A based on f2 itself or f2−f1. Similarly, when the third signal S3 is applied to the second object 201B, the detection unit 151 can identify the second object 201B based on the third frequency f3. In other words, the detection unit 151 can recognize the detected signal as a signal regarding the second object 201B. The detection unit 151 may identify the second object 201B based on f3 itself or f3−f1. This allows the detection unit 151 to distinguish an interference wave of the first object 201A and an interference wave of the second object 201B.

Operation of the sensor device 101 in FIG. 8 is the same as that of the sensor device 101 in FIG. 1. Descriptions regarding FIGS. 1 to 7 are applicable to not only the sensor device 101 in FIG. 1 but also the sensor device 101 in FIG. 8.

In subsequent to above description regarding the first embodiment, a second embodiment will be described below. The second embodiment is a variation of the first embodiment, and the second embodiment will be described focusing on the differences from the first embodiment.

Second Embodiment

Figure 9:
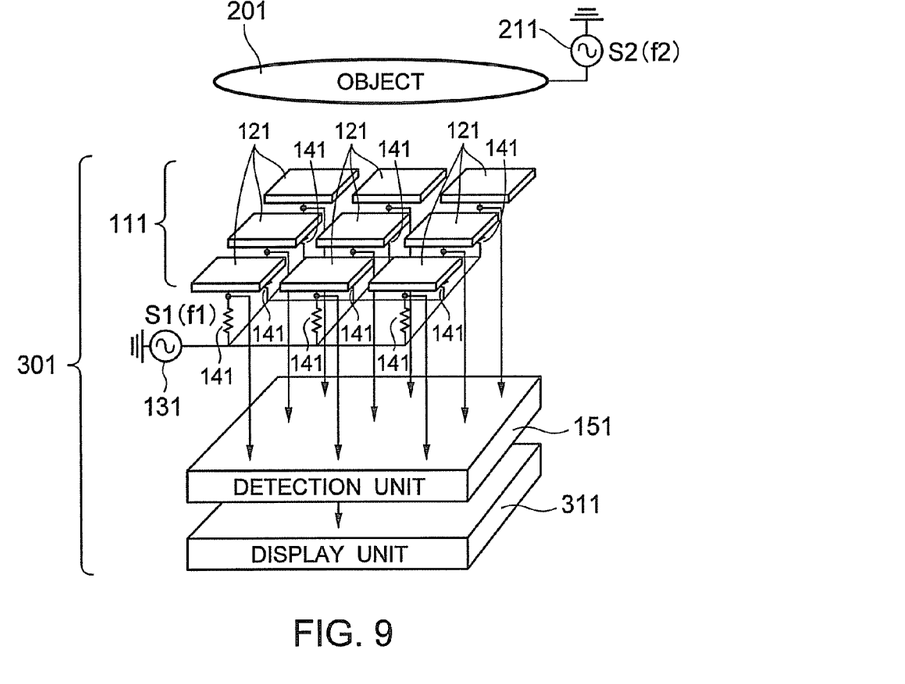
FIG. 9 is a drawing for illustrating a display apparatus according to a second embodiment.

FIG. 9 is a drawing for illustrating a display apparatus 301 according to a second embodiment. FIG. 9 illustrates an object 201 to be detected which is similar to that in FIG. 1, and the display apparatus 301.

The display apparatus 301 in FIG. 9 includes an electrode array 111, a first signal generator 131, and a detection unit 151, as similar to the sensor device 101 in FIG. 1. As described above, the detection unit 151 detects a distance between each electrode 121 and the surface of the object 201, or irregularities on the surface of the object 201.

The display apparatus 301 in FIG. 9 further includes a display unit 311. The display unit 311 displays a shape of the surface of the object 201 on a screen, using the distance or the irregularities detected regarding the object 201. In this way, a detection result by the detection unit 151 is visually provided to a user.

Figure 10:
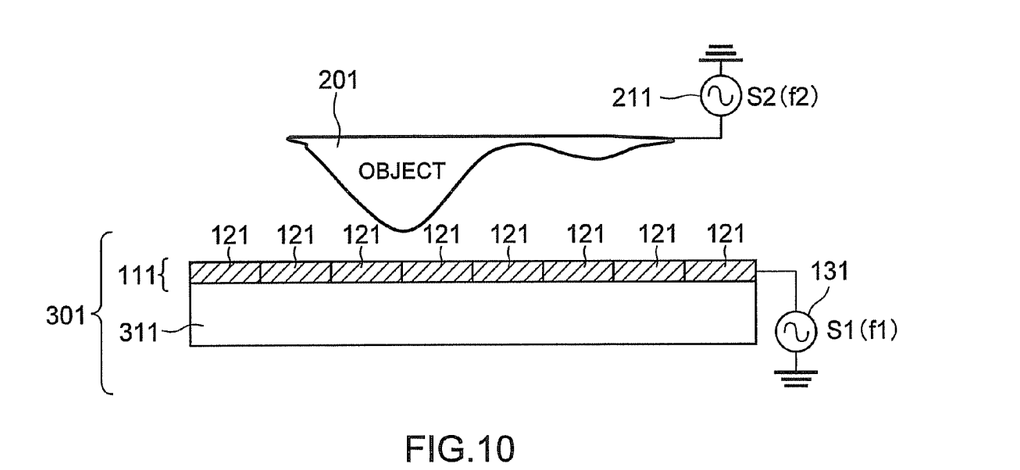
FIG. 10 is a side view for illustrating an electrode array and a display unit.

In this embodiment, each electrode 121 of the electrode array 111 corresponds to one pixel of the display unit 311. In this embodiment, as illustrated in FIG. 10, the electrode array 111 may be provided on the screen of the display unit 311. In this case, each electrode 121 of the electrode array 111 is transparent so as not to interfere with display.

Figure 11:
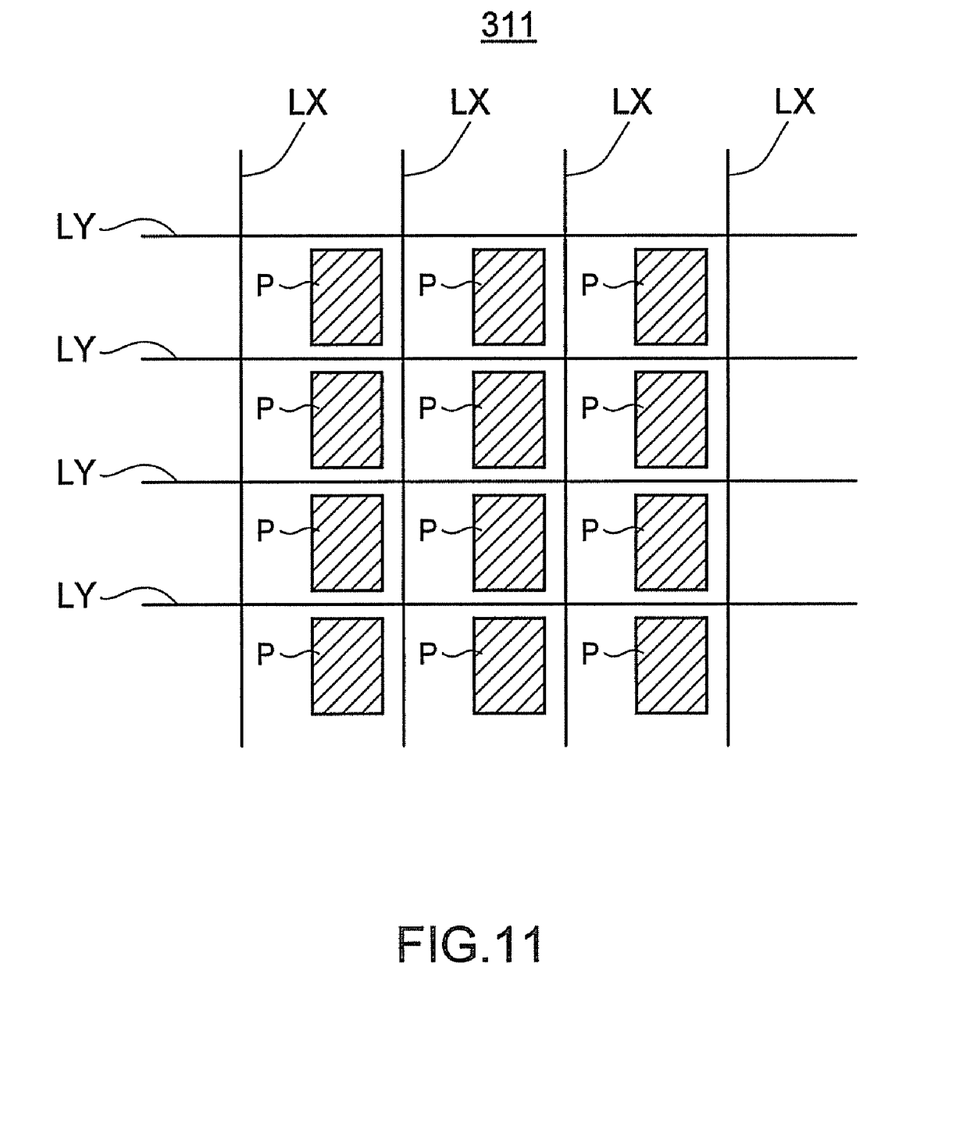
FIG. 11 is a top view for illustrating the electrode array and the display unit.

FIG. 11 illustrates an example of a line structure of the display unit 311. The display unit 311 in FIG. 11 includes plural signal lines LX, plural gate lines LY, and plural pixel electrodes P. The signal lines LX and the gate lines LY form a grid-shaped line structure. The pixel electrodes P form pixels of the display unit 311. In this embodiment, the signal lines LX, the gate lines LY, or the pixel electrodes P may be the electrodes 121 of the electrode array 111. Further, in this embodiment, two or more of the signal lines LX, the gate lines LY, and the pixel electrodes P may be the electrodes 121 of the electrode array 111.

Figure 12:
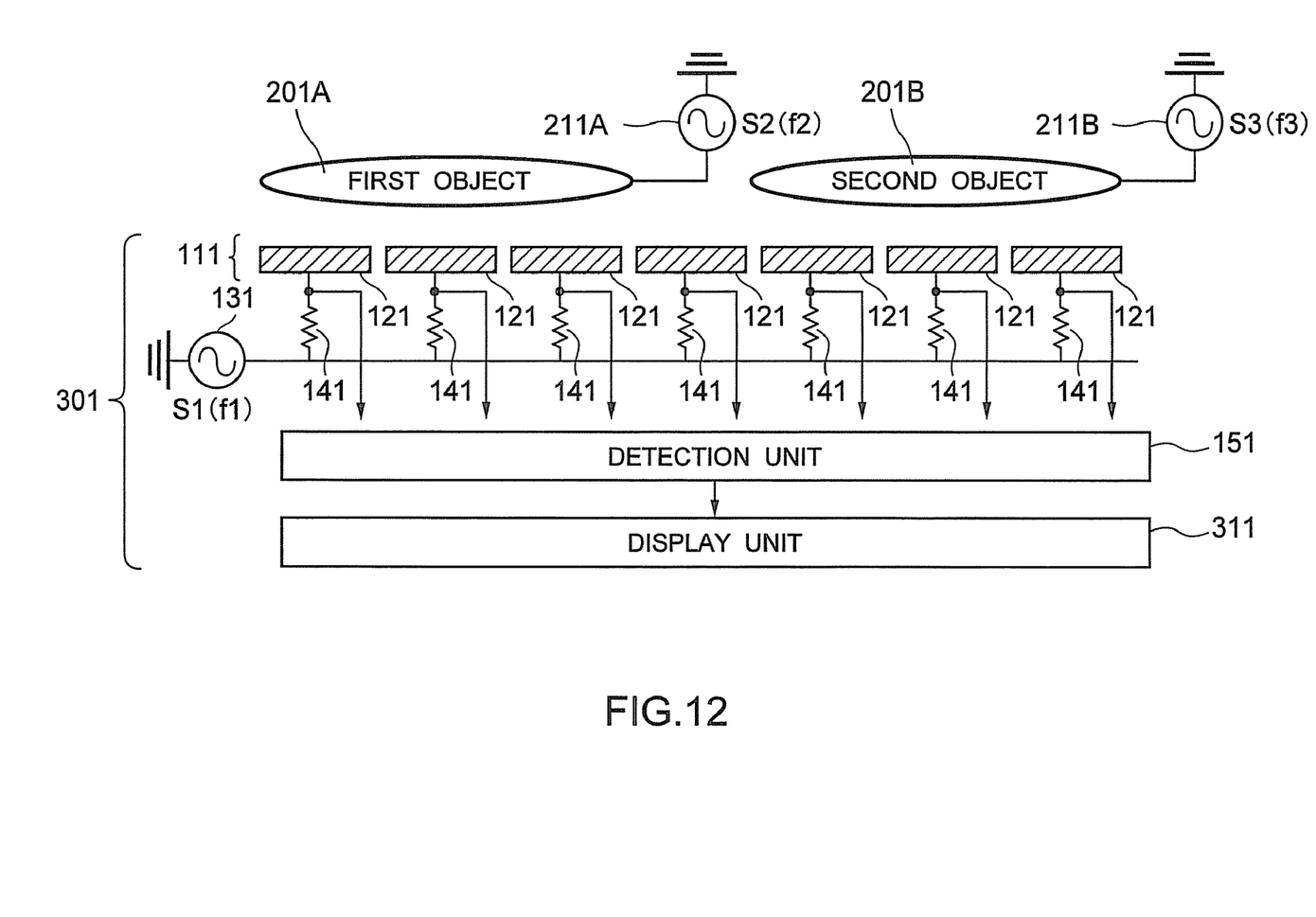
FIG. 12 is a drawing for illustrating a display apparatus according to the second embodiment.

The display apparatus 301 in this embodiment can handle not only one object 201 but also two or more objects 201. Referring to FIG. 12, an example of such a display apparatus 301 will be described. FIG. 12 illustrates a first object 201A to be detected which is similar to that in FIG. 8, a second object 201B to be detected which is similar to that in FIG. 8, and the display apparatus 301.

The display apparatus 301 in FIG. 12 includes an electrode array 111, a first signal generator 131, and a detection unit 151, as similar to the sensor device 101 in FIG. 8. As described above, the detection unit 151 detects a distance between each electrode 121 and the surface of the first object 201A, irregularities on the surface of the first object 201A, a distance between each electrode 121 and the surface of the second object 201B, or irregularities on the surface of the second object 201B.

The display apparatus 301 in FIG. 12 further includes a display unit 311. The display unit 311 displays a shape of the surface of the first object 201A on a screen, using the distance or the irregularities detected regarding the first object 201A. Further, the display unit 311 displays a shape of the surface of the second object 201B on a screen, using the distance or the irregularities detected regarding the second object 201B. In this way, a detection result by the detection unit 151 is visually provided to a user.

Operation of the display apparatus 301 in FIG. 12 is the same as that of the display apparatus 301 in FIG. 9. Descriptions regarding FIGS. 9 to 11 are applicable to not only the display apparatus 301 in FIG. 9 but also the display apparatus 301 in FIG. 12.

As described above, the embodiments of the present invention can provide a sensor device and a display apparatus which can perform a preferred detection process for an object to be detected.

The invention claimed is:

1. A sensor device comprising:
an electrode array having plural electrodes arranged in an array manner;
a signal generator configured to generate a first signal having a first frequency, and apply the first signal to the plural electrodes; and
a detection unit configured to,
when the first signal is applied to the plural electrodes, and a second signal having a second frequency is applied to an object to be detected,
detect a distance between each electrode included in the electrode array and the surface of the object, using an interference wave between the first signal applied to each electrode and the second signal applied to the object, or
detect irregularities on the surface of the object, using a signal generated by using the interference wave outputted from one electrode and the interference wave outputted from another electrode.

2. The device according to claim 1, wherein the second signal is applied to the object itself, or is applied to an electrode provided on the object.

3. The device according to claim 1, wherein the detection unit detects the distance between each electrode included in the electrode array and the surface of the object, using an amplitude of an envelope component of the interference wave.

4. The device according to claim 3, wherein the detection unit detects the distance, using an amplitude of a node of the envelope component.

5. The device according to claim 1, wherein the detection unit generates a difference signal between an envelope component of the interference wave from one electrode and an envelope component of the interference wave from another electrode, and detects the irregularities on the surface of the object, using an amplitude of the difference signal.

6. The device according to claim 5, wherein the detection unit detects the irregularities larger than a predetermined gradient, by detecting the amplitude larger than a predetermined threshold.

7. The device according to claim 5, wherein,
the detection unit includes:
a first low-pass filter configured to extract the envelope component of the interference wave from one electrode;
a second low-pass filter configured to extract the envelope component of the interference wave from another electrode; and
a differential amplifier configured to generate a difference signal between the envelope component extracted by the first low-pass filter and the envelope component extracted by the second low-pass filter.

8. The device according to claim 1, wherein the detection unit generates a difference signal between the interference wave from one electrode and the interference wave from another electrode, and detects the irregularities on the surface of the object, using an amplitude of an envelope component of the difference signal.

9. The device according to claim 8, wherein the detection unit detects the irregularities larger than a predetermined gradient, by detecting the amplitude larger than a predetermined threshold.

10. The device according to claim 8, wherein,
the detection unit includes:
a differential amplifier configured to generate the difference signal between the interference wave from one electrode and the interference wave from another electrode; and
a low-pass filter configured to extract an envelope component of the difference signal generated by the differential amplifier.

11. The device according to claim 1, wherein the signal generator for generating the first signal is capable of changing the first frequency, and a signal generator for generating the second signal is provided on the object and is capable of changing the second frequency.

12. The device according to claim 1, wherein the ratio f2/f1 of the first frequency f1 to the second frequency f2 is 0.75 to 0.95, or 1.05 to 1.25.

13. A sensor device comprising:
an electrode array having plural electrodes arranged in an array manner;
a signal generator configured to generate a first signal having a first frequency, and apply the first signal to the plural electrodes; and
a detection unit configured to,
when the first signal is applied to the plural electrodes, and a second signal having a second frequency is applied to a first object to be detected,
identify the first object based on the second frequency, and
detect a distance between each electrode included in the electrode array and the surface of the first object, using an interference wave between the first signal applied to each electrode and the second signal applied to the first object, or
detect irregularities on the surface of the first object, using a signal generated by using the interference wave outputted from one electrode and the interference wave outputted from another electrode, and
when the first signal is applied to the plural electrodes, and a third signal having a third frequency is applied to a second object to be detected,
identify the second object based on the third frequency, and
detect a distance between each electrode included in the electrode array and the surface of the second object, using an interference wave between the first signal applied to each electrode and the third signal applied to the second object, or
detect irregularities on the surface of the second object, using a signal generated by using the interference wave outputted from one electrode and the interference wave outputted from another electrode.

14. The device according to claim 13, wherein the second frequency is different from the third frequency.

15. The device according to claim 13, wherein the ratio f2/f1 of the first frequency f1 to the second frequency f2 is 0.75 to 0.95, or 1.05 to 1.25, and the ratio f3/f1 of the first frequency f1 to the third frequency f3 is 0.75 to 0.95, or 1.05 to 1.25.

16. A display apparatus comprising:
    an electrode array having plural electrodes arranged in an array manner;
    a signal generator configured to generate a first signal having a first frequency, and apply the first signal to the plural electrodes;
    a detection unit configured to,
    when the first signal is applied to the plural electrodes, and a second signal having a second frequency is applied to an object to be detected,
    detect a distance between each electrode included in the electrode array and the surface of the object, using an interference wave between the first signal applied to each electrode and the second signal applied to the object, or
    detect irregularities on the surface of the object, using a signal generated by using the interference wave outputted from one electrode and the interference wave outputted from another electrode; and
    a display unit configured to display a shape of the surface of the object on a screen, using the distance or the irregularities detected regarding the object.

17. The apparatus according to claim 16, wherein each electrode of the electrode array corresponds to one pixel of the display unit.

18. The apparatus according to claim 16, wherein the plural electrodes are transparent.

19. The apparatus according to claim 16, wherein,
    the display unit includes a signal line, a gate line forming a grid-shaped line structure together with the signal line, and a pixel electrode forming a pixel of the display unit, and
    the plural electrodes include at least one of the signal line, the gate line, and the pixel electrode.

20. A display apparatus comprising:
    an electrode array having plural electrodes arranged in an array manner;
    a signal generator configured to generate a first signal having a first frequency, and apply the first signal to the plural electrodes;
    a detection unit configured to,
    when the first signal is applied to the plural electrodes, and a second signal having a second frequency is applied to a first object to be detected,
    identify the first object based on the second frequency, and
    detect a distance between each electrode included in the electrode array and the surface of the first object, using an interference wave between the first signal applied to each electrode and the second signal applied to the first object, or
    detect irregularities on the surface of the first object, using a signal generated by using the interference wave outputted from one electrode and the interference wave outputted from another electrode, and
    when the first signal is applied to the plural electrodes, and a third signal having a third frequency is applied to a second object to be detected,
    identify the second object based on the third frequency, and
    detect a distance between each electrode included in the electrode array and the surface of the second object, using an interference wave between the first signal applied to each electrode and the third signal applied to the second object, or
    detect irregularities on the surface of the second object, using a signal generated by using the interference wave outputted from one electrode and the interference wave outputted from another electrode; and
    a display unit configured to display a shape of the surface of the first object on a screen, using the distance or the irregularities detected regarding the first object, and display a shape of the surface of the second object on a screen, using the distance or the irregularities detected regarding the second object.

* * * * *